(12) United States Patent
Mousavi et al.

(10) Patent No.: US 10,281,504 B2
(45) Date of Patent: May 7, 2019

(54) METHOD AND APPARATUS FOR ANALYZING WAVEFORM SIGNALS OF A POWER SYSTEM

(75) Inventors: Mirrasoul Mousavi, Cary, NC (US); Mohamed Y. Haj Maharsi, Cypress, TX (US)

(73) Assignee: ABB Schweiz AG, Baden (CH)

( * ) Notice: Subject to any disclaimer, the term of this patent is extended or adjusted under 35 U.S.C. 154(b) by 543 days.

(21) Appl. No.: 12/922,929

(22) PCT Filed: Mar. 25, 2009

(86) PCT No.: PCT/US2009/038224
§ 371 (c)(1),
(2), (4) Date: May 4, 2011

(87) PCT Pub. No.: WO2009/120765
PCT Pub. Date: Oct. 1, 2009

(65) Prior Publication Data
US 2011/0213577 A1  Sep. 1, 2011

Related U.S. Application Data

(60) Provisional application No. 61/039,205, filed on Mar. 25, 2008.

(51) Int. Cl.
*G01R 19/25* (2006.01)
*G05B 23/02* (2006.01)
*G06F 17/18* (2006.01)

(52) U.S. Cl.
CPC ..... *G01R 19/2513* (2013.01); *G01R 19/2509* (2013.01); *G05B 23/0221* (2013.01); *G06F 17/18* (2013.01)

(58) Field of Classification Search
CPC .. G01R 19/2509; G06F 17/18; G05B 23/0221
(Continued)

(56) References Cited

U.S. PATENT DOCUMENTS 5,819,203 A  10/1998  Moore et al.
6,522,509 B1 *  2/2003  Engel ............... H02H 1/0015
                                                        361/42
(Continued)

FOREIGN PATENT DOCUMENTS

GB         2431475         4/2007
WO  WO 2007045682 A1 *  4/2007
WO       2009120765       10/2009

OTHER PUBLICATIONS

Mohanty, A Cumulative Sum-Based Fault Detector for Power System Relaying Application, IEEE Transactions on Power Delivery, vol. 23, No. 1, Jan. 2008.*

(Continued)

*Primary Examiner* — Michael J Dalbo
(74) *Attorney, Agent, or Firm* — Taft Stettinius & Hollister LLP; J. Bruce Schelkopf

(57) ABSTRACT

Method and apparatus for analyzing waveform signals of a power system. A waveform signal obtained from the power system is digitalized and then filtered. One or more segments are identified on the filtered waveform signal and, based on the information content of the identified segments, each of the one or more identified segments are classified as corresponding to a normal or abnormal condition occurred in the power system.

19 Claims, 5 Drawing Sheets

(58) Field of Classification Search
USPC .......................................................... 702/66
See application file for complete search history.

(56) References Cited

U.S. PATENT DOCUMENTS

| | | | | |
|---|---|---|---|---|
| 7,529,790 | B1* | 5/2009 | Sayal | G06F 17/18 |
| | | | | 708/422 |
| 7,836,111 | B1* | 11/2010 | Shan | 708/200 |
| 7,899,523 | B2* | 3/2011 | Logier et al. | 600/516 |
| 2004/0102710 | A1 | 5/2004 | Kim | |
| 2004/0183522 | A1* | 9/2004 | Gunn | G01R 15/185 |
| | | | | 324/126 |
| 2004/0225649 | A1* | 11/2004 | Yeo | G01D 4/004 |
| 2005/0187725 | A1* | 8/2005 | Cox | 702/60 |
| 2006/0028197 | A1* | 2/2006 | Quiquempoix | 324/142 |
| 2006/0178877 | A1 | 8/2006 | Jiang et al. | |
| 2006/0187074 | A1* | 8/2006 | O'Sullivan | G01R 15/142 |
| | | | | 340/660 |
| 2006/0212238 | A1 | 9/2006 | Nisenblat et al. | |
| 2008/0071482 | A1* | 3/2008 | Zweigle | G01R 19/2513 |
| | | | | 702/62 |
| 2008/0204955 | A1* | 8/2008 | Parker | H02H 1/0015 |
| | | | | 361/87 |
| 2008/0270071 | A1* | 10/2008 | Marvasti et al. | 702/179 |

OTHER PUBLICATIONS

E. Styvaktakis et al., Expert System for classification and analysis of power system events, IEEE Transactions on Power Delivery, vol. 17, No. 2, Apr. 2002, pp. 423-428.

A. Girgis et al., "Analysis of high-impedance fault generated signals using a Kalman filtering approach", IEEE Transactions on Power Delivery, vol. 5, No. 4, Nov. 1990, pp. 1714-1724.

A. M. Gaouda et al., "Application of multiresolution signal decomposition for monitoring short-duration variations in distribution systems", IEEE Transactions on Power Delivery, vol. 15, No. 2, Apr. 2000, pp. 478-485.

J. T. Chang et al., "Detecting when a monotonically increasing mean has crossed a threshold", J. Qual. Technol., vol. 31, No. 2, Apr. 1999, pp. 217-234.

M. Basseville et al., Detection of Abrupt Changes: Theory and Application, Englewood Cliffs, NJ, Prentice Hall, 1993, Chapter 2, Change Detection Algorithms, pp. 40-41.

R. O. Duda et al., Pattern Classification, 2nd Edition, New York, Wiley, 2001, Chapter 10, pp. 526-527.

* cited by examiner

METHOD AND APPARATUS FOR ANALYZING WAVEFORM SIGNALS OF A POWER SYSTEM

BACKGROUND OF THE INVENTION

The present invention relates to a method and apparatus for analyzing waveform signals of a power system.

In recent years, advancements in microprocessor-based devices and digital signal processing technologies combined with increased emphasis on power system reliability and online monitoring have led to the proliferation of various types of Intelligent Electronic Devices (IEDs) that record and store digital waveforms along with other data. The recorded data are primarily utilized for protection and control applications, but there is abundant information embedded in the raw measurements that are seldom utilized regularly.

For instance, a current waveform captured before, during, and after a fault or an event by an IED contains unique information for monitoring, identification, fault location, and classification purposes. The information extracted from these measurements may provide invaluable insights into the type and extent of the fault, which helps to better plan and prepare for the remedial actions by the maintenance crew in the field. This is traditionally performed by a trained individual on limited cases. The net effect of using this information partially includes direct and indirect reduction in the operation and maintenance costs.

Most electric utilities record field data, operational and non-operational, but the overwhelming nature of manual data analysis, lack of human resources, and inevitable inconsistencies preclude delivering meaningful information to the operation and maintenance crew. As a result, a substantial portion of these useful measurements, mostly non-operational, is often abandoned and never utilized.

Some automated analyses of digital waveforms signals have been proposed in the prior art dealing in particular with the difficult tasks involved in the front-end processing, namely waveform segmentation and classification of the segments into predetermined classes.

Many segmentation methods in the prior art are based on Kalman filters. The filter is employed to model the waveform and the residuals are used for segmentation. In common with other model-based approaches, the response of the filter is affected by the accuracy of the model, its parameters, and settings. Also, the detection capability of the model is a function of the magnitude of the change, harmonic contents, and other frequency components not modeled in the designed filter. Although the filtering approach has been used in some model-based applications, it has some drawbacks for online and IED applications. The Kalman filter is computationally expensive, and limited by the accuracy of the model it represents. Furthermore, fine-tuning the filter parameters is cumbersome and requires prior hard-to-find information in many practical cases.

Multi-resolution signal decomposition methods based on wavelets are also proposed for modeling and analysis purposes. The information obtained at different resolution levels and the measured values are used to analyze signal segments. Designed primarily for monitoring power quality problems, wavelet-based approaches are not suitable for embedded applications due in part to the extensive computational and storage requirements.

It would be therefore desirable to provide a solution for analyzing waveform signals in power systems that does not require modeling and can be implemented in IEDs and executed online or offline in computerized applications. This solution is provided by the method and apparatus of the present invention.

SUMMARY OF THE INVENTION

A method for analyzing waveform signals of a power system, has the steps of:

a) digitalizing using a computing device a waveform signal obtained from the power system;

b) filtering using the computing device the digitalized waveform signal, the filtering occurring without any pre-modeling of the digitalized waveform signal;

c) using in the computing device a recursive cumulative sum technique to identify one or more segments on the filtered waveform signal comprising:

i. determining change points on the filtered waveform signal by using a monitoring process in which there is no target value for a reference change parameter to accumulate a value for the reference change parameter that is a predetermined change in the filtered waveform signal;

ii. continuing the accumulation of the values for the reference change parameter until all changes occurring in a defined threshold are detected in the filtered waveform signal; and iii. declaring a change point when the accumulated value for the reference change parameter occurring in the defined threshold is equal to or higher than a predefined alarm value;

d) using in the computing device after the one or more segments are identified on the filtered waveform signal information content in the digitalized waveform signal about each of the one or more identified segments to classify each of the one or more identified segments as corresponding to a normal or abnormal condition having occurred in the power system; and e) using in the computing device information extracted from the segments classified as corresponding to an occurrence of the abnormal condition in the power system for planning and preparing actions to address the abnormal condition.

An intelligent electronic device suitable to be connected to a power system has a computer device having code therein configured to:

a) digitalize a waveform signal obtained from the power system;

b) filter the digitalized waveform signal, the filtering occurring without any pre-modeling of the digitalized waveform signal;

c) use a recursive cumulative sum technique to identify one or more segments on the filtered waveform signal comprising:

i. determining change points on the filtered waveform signal by using a monitoring process in which there is no target value for a reference change parameter to accumulate a value for the reference change parameter that is a predetermined change in the filtered waveform signal;

ii. continuing the accumulation of the values for the reference change parameter until all changes occurring in a defined threshold are detected in the filtered waveform signal; and iii. declaring a change point when the accumulated value for the reference change parameter occurring in the defined threshold is equal to or higher than a predefined alarm value;

d) using after the one or more segments are identified on the filtered waveform signal information content in the digitalized waveform signal about each of the one or more identified segments to classify each of the one or more identified segments as corresponding to a normal or abnormal condition having occurred in the power system; and e) use information extracted from the segments classified as corresponding to the occurrence of an abnormal condition in the power system for planning and preparing actions to address the abnormal condition.

A non-transitory computer readable medium for analyzing waveform signals of a power system has computer-readable instructions stored thereon for execution by a computing device to perform a method that the steps of:

a) digitalizing a waveform signal obtained from the power system;

b) filtering the digitalized waveform signal, the filtering occurring without any pre-modeling of the digitalized waveform signal;

c) using a recursive cumulative sum technique to identify one or more segments on the filtered waveform signal comprising:

i. determining change points on the filtered waveform signal by using a monitoring process in which there is no target value for a reference change parameter to accumulate a value for the reference change parameter that is a predetermined change in the filtered waveform signal;

ii. continuing the accumulation of the values for the reference change parameter until all changes occurring in a defined threshold are detected in the filtered waveform signal; and iii. declaring a change point when the accumulated value for the reference change parameter occurring in the defined threshold is equal to or higher than a predefined alarm value;

d) using after the one or more segments are identified on the filtered waveform signal information content in the digitalized waveform signal about each of the one or more identified segments to classify each of the one or more identified segments as corresponding to a normal or abnormal condition having occurred in the power system, and e) using information extracted from the segments classified as corresponding to an occurrence of an abnormal condition in the power system for planning and preparing actions to address the abnormal condition.

BRIEF DESCRIPTION OF THE DRAWINGS

The features, aspects, and advantages of the present invention will become better understood with regard to the following description, appended claims, and accompanying drawings where:

DETAILED DESCRIPTION OF ILLUSTRATIVE EMBODIMENTS

Figure 1:
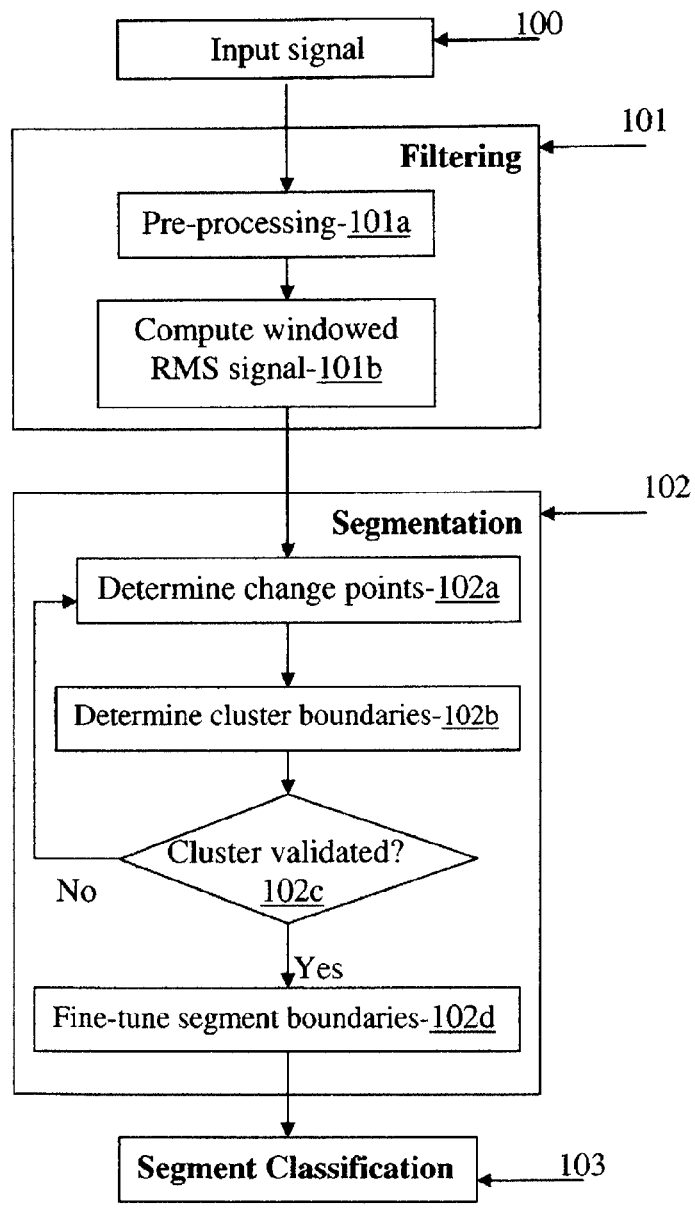
FIG. 1 is a flow chart illustrating a method for analyzing waveform signals of a power system in accordance to the present invention.

It should be noted that in the detailed description that follows, identical or functionally equivalent components have the same reference numerals, regardless of whether they are shown in different embodiments of the present invention. It should also be noted that in order to clearly and concisely disclose the present invention, the drawings may not necessarily be to scale and certain features of the invention may be shown in somewhat schematic form.

As illustrated in FIG. 1, in the method according to the invention, a waveform signal, indicated as an input signal, is obtained from a power system. Preferably, the input signal 100 is a current or voltage signal which can be obtained by common sensors or similar devices from any component of a power system, such as an electrical device or a power line. The obtained signal is digitalized at step 100.

At step 101, the digitalized waveform signal is filtered without requiring any pre-modeling of the signal under filtration. In particular, at the filtering step 101 the input signal is first preprocessed. This step (101$a$) of preprocessing the digitalized input signal includes for example re-sampling, namely the input signal is up-sampled or down-sampled in order to achieve a proper sampling frequency. In addition, DC and noise removal is also performed so as to eliminate possible measurement DC offsets and noise components.

The pre-processed signal is then filtered into a proper statistics for subsequent processing, in particular for application of change detection algorithms as it will be described hereinafter. Preferably, at this step (101$b$) the filter output yields the Root Mean Square (RMS) signal calculated over an overlapping moving window of fixed size. In practice, a window of a certain number of samples is selected, for instance thirty-two samples, and the RMS value is calculated for this window. Then a new window moved forward of some samples and partially overlapping with the previous one is selected and the RMS value is calculated also for this window. These calculations can be performed preferably in the time domain; the frequency domain can be used as well in which the input signal is the fundamental component (e.g. 60 Hz).

Alternatively, at step 101$b$ the filtering stage can yield the fundamental component after performing a DFT (Fourier Transform) analysis of the pre-processed signal, or simply its squared values.

Figure 2:
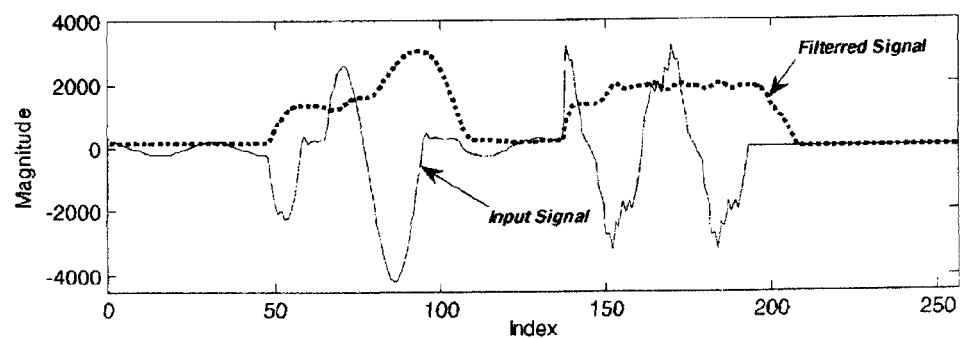
FIG. 2 shows an exemplary plot of an input signal acquired from a power system and its corresponding Root Mean Square (RMS) signal calculated over a half-cycle window of 16 samples.

FIG. 2 shows an exemplary plot of an input signal along with its corresponding RMS signal, calculated over a half-cycle window of 16 samples. In addition to being proper for change detection algorithms, the RMS signal mitigates the effect of noisy spikes and outliers in the data.

At step 102, the RMS signal, shown in FIG. 2, is subsequently used in the change detection algorithm to find approximate segment intervals. In particular, the filtered signal is viewed as a series of observations or realizations from a random process that experiences additive changes in the mean value. The goal is to monitor the observations and detect all change times or points that are indicated by a decision function.

In particular at step 102a, candidate change points are determined through a change detection problem. The change detection problem is solved through an online recursive version of the Cumulative Sum (CUSUM) algorithm. The original CUSUM algorithm is traditionally applied in quality control applications. In classic quality control, change detection typically involves a hypothesis testing of a parameter ($\mu$) where samples of fixed size ($X_i$) are taken and a decision is made to choose one of the two hypotheses about the parameter. As expressed in equations (1) below, the null hypothesis $H_0$ holds true when there is no change in the parameter's initial value ($\mu_0$) and the alternative hypothesis $H_1$ prevails when the parameter changes. The process is called in-control as long as the decision is made in favor of $H_0$. Once the decision rule indicates that $H_1$ holds true, monitoring stops and a change point is detected. An optimal decision rule is obtained by using an alarm value (h).

$$H_0: \mu = \mu_0$$
$$H_1: \mu = \mu_1 \quad (1)$$

The Cumulative Sum algorithm detects when the parameter of interest experiences a single jump from one level to another. The corresponding decision function ($g_k$)—given in the following equation (2)—is the difference between the current value of the cumulative sum of the log-likelihood ratios ($S_k$) and its current minimum ($m_k$). The cumulative sum function typically shows a decreasing trend before the change and an increasing trend after the change.

$$g_k = S_k - m_k \quad (2)$$

where:

$$m_k = \min_{1 \le j \le k} S_j,$$

$$S_k = \sum_{i=1}^{k} s_i, \text{ and}$$

$$s_i = \ln \frac{p_{\mu_1}(X_i)}{p_{\mu_0}(X_i)}$$

The stopping time ($t_a$)) given in equation (3) is reached when the decision function ($g_k$) exceeds the alarm value (h) or equivalently, the cumulative sum crosses an adaptive threshold of $m_k + h$.

$$t_a = \min\{k: S_k \ge m_k + h\} = \min\{k: g_k \ge h\} \quad (3)$$

As opposed to the original CUSUM monitoring, in the method according to the invention, the change detection involves a monitoring process in which there is no target value for the change parameter. Preferably, in the present invention, the reference change parameter is the change in the RMS signal assumed as the mean value of a random process.

As mentioned, the RMS signal is viewed as a series of observations and the monitoring continues until all change times are detected. The change detection problem is solved through an online recursive version of the CUSUM according to the following equation:

$$W_n = \text{Max}(0, W_{n-1} + X_n - T), n = 1, 2, \ldots, N \quad (4)$$

where $W_n$ is the CUSUM response computed at sample n, $X_n$ is the $n^{th}$ observation, and T is a user-defined reference value or threshold.

When the cumulative value $W_n$ calculated for the selected representative parameter reaches the alarm value (h) a change point is declared. The proper selection of T is data-dependent; for example, for relay applications the threshold can be selected as the pickup value for the overcurrent protection element. In general, increasing or decreasing the threshold value has a direct impact on the meaning of a change. The alarm value (h) defines the intentional delay introduced in the detection. The intentional delay is to mitigate the effect of noise and outlier components. When the alarm value is zero, the detection is declared as soon as the CUSUM output crosses the threshold (T) even if it happens once due to a noisy sample. For practical applications, the threshold crossing needs to be maintained for a while before a change point can be declared. The alarm value (h) controls this behavior of CUSUM. The higher is the value of h, the larger is the detection delay.

As indicated before, a change point is detected whenever $W_n \ge h$ and the corresponding signal index is denoted as the detection index. As for the initial conditions, $W_0 = 0$, and $X_n$ is the $n^{th}$ instantaneous value of the filtered signal (RMS). An exemplary plot of detection indices obtained from the application of the change detection algorithm is given in FIG. 3. These detection indices are the change point indices CPI resulting from the CUSUM algorithm. In the example illustrated, the algorithm uses a threshold value of 300 and an alarm value of 10. Numerically, the first set of indices is from 50 to 108 and from 138 to 206 in FIG. 3.

Figure 3:
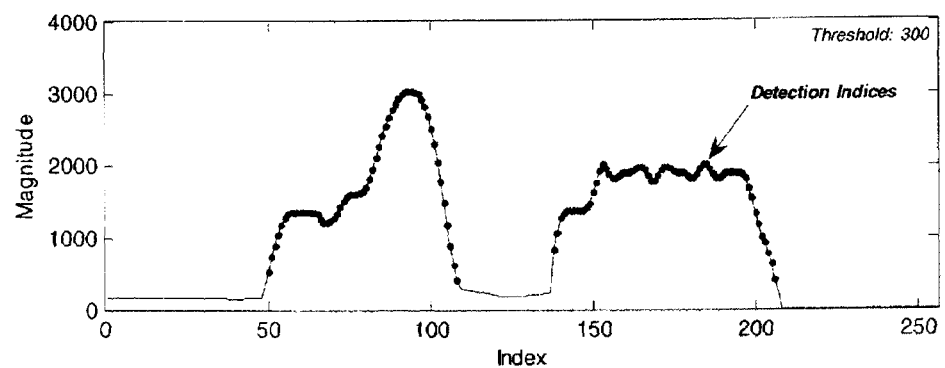
FIG. 3 shows an exemplary plot of detection indices identified on the RMS signal of FIG. 2.
Figure 4:
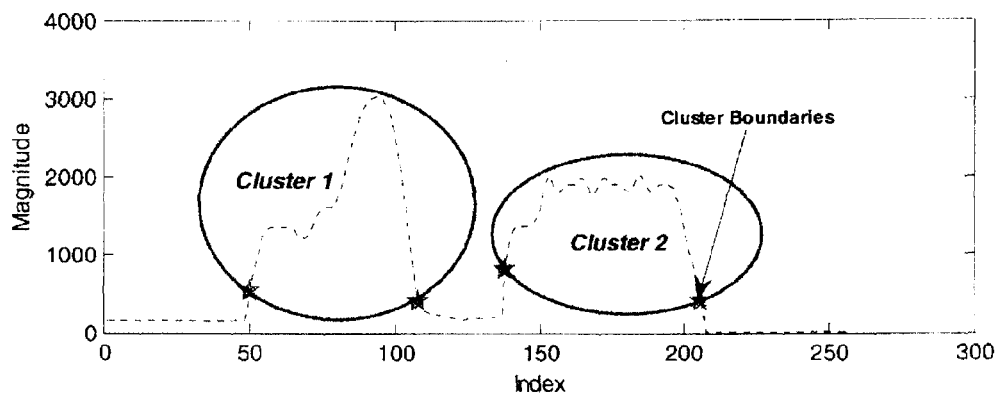
FIG. 4 is an exemplary plot showing the detection indices identified in FIG. 3 and grouped into two clusters with related boundaries according to the method and apparatus of the present invention.

After identifying all change points, at step 102a the resulting CPIs are grouped into clusters, as shown in FIG. 4, to obtain segment or cluster boundaries which denote approximate segments of the filtered waveform signal. In practice, the boundaries obtained in this step are close to the actual change points but not exactly matching the true change points. The exemplary plot of the detection indices shown in FIG. 3 is shown by a dashed line in FIG. 4.

A fast clustering approach uses a difference function and a cut-off value. So long as the difference between successive indices is below a cut-off value, no new clusters are formed. Each time the difference between successive identified change points is above a predefined cut-off value, a new cluster is formed. A typical cut-off value for a 60/50 Hz signal is one quarter of a cycle. For a 60 Hz signal sampled at 32 samples per cycle, the typical cut-off value is therefore 8.

Figure 5:
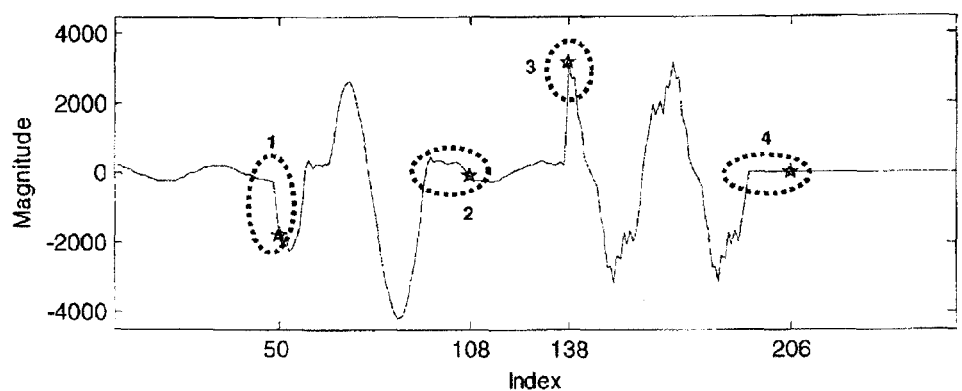
FIG. 5 shows an exemplary plot of the input signal of FIG. 2 with signal indices selected for fine-tuning according to the method and apparatus according of the present invention.

The clustering results applied to the detection indices shown in FIG. 3 and again in FIG. 4 by a dashed line are given in FIG. 5 where two clusters are identified. The cluster boundary indices specify the approximate change times in each segment with inherent detection delay, i.e. the time difference between the actual change time and the detected change time. The star points in FIG. 5 correspond to signal samples 50, 108, 138, and 206.

At step 102c, the validity of the clusters obtained is examined relative to the selected thresholds, alarm values, and cut-offs, and—if necessary—the thresholds, alarm and cut-offs values used are adjusted. The validation involves the measurement of the goodness of clustering with respect to different parameters which produce dissimilar clustering results.

Figure 7:
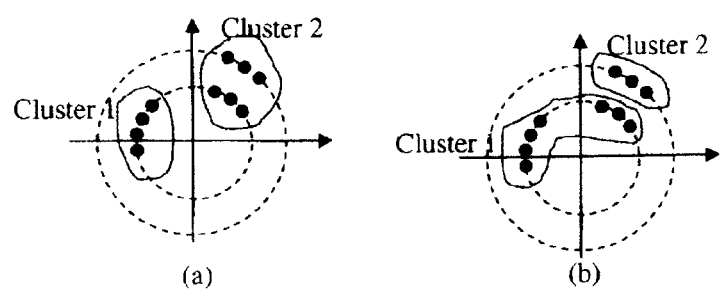
FIG. 7 shows two different clustering results using same patterns when performing cluster validation according to the method and apparatus of the present invention.

Cluster validity measures are used to identify the most appropriate parameter values from a subjective or an objective point of view. Objective measures assess the structural properties of the clustering result. For instance, proximity to the origin in the example of FIG. 7 could be an objective measure assessing the structural property of the patterns. If these properties are well developed, clusters are acceptable.

For instance, the Davies-Bouldin validity index is an example of objective measure that most often is utilized to guide the number of clusters. This index is a function of the ratio of the sum of within-cluster scatter to between-cluster separation, which uses both the clusters and their sample means. For C number of clusters, the DB index can be mathematically expressed as in the following equations (5):

$$DB = \frac{1}{c}\sum_{i=1}^{c} R_i \text{ with}$$

$$R_i = \max_{\substack{j=1,\ldots,n, \\ i \neq j}} R_{ij} \text{ and } R_{ij} = \frac{S_i + S_j}{d_{ij}} \text{ where}$$

(5)

$S_i$ is within-cluster scatter and $d_{ij}$ is a cluster to cluster distance measure. Given the centroids $C_i$ of the cluster Ci, these measures are typically defined by the following equations:

$$S_i = \frac{1}{|C_i|}\sum_{x \in C_i}\|x - c_i\|$$ (6)

$$d_{ij} = \|c_i - c_j\|$$ (7)

The goal is to maximize the between-cluster distances and minimize the within-cluster scatter. Therefore, the number of clusters that minimizes the DB Index is taken as the optimal number of clusters. Preferably, the optimum number of clusters may be achieved by incorporating both subjective and objective measures. In this example, the number of clusters from a subjective point of view is limited by the length of the signal being processed and how fast events can occur in succession. For instance, if the clustering is applied to a record from circuit breaker operations, it is conceivable that each cluster should contain samples of more than a few cycles of 50/60 Hz as the circuit breaker trip or reclose operations would not be faster than a few cycles. Therefore, clusters formed on a sub-cycle or a cycle of samples are an invalid result.

Once the approximate cluster boundaries are adjusted, if any, the final step (102d) in the segmentation phase (step 102) involves fine-tuning. In this step 102d, which can be viewed as an objective tightening of the cluster boundaries, the detection delay is minimized or eliminated through the application of an unsupervised classification technique, i.e. a technique which does not require training data. It is to be noticed that in the method according to the invention, the classification uses the input signal and not the filtered signal samples. Thus, the classification technique is applied retroactively to the input signal values, for example eight values, which reside in the left neighborhood of the cluster boundary indices. Then the method proceeds with the unsupervised classification. The inherent property used in the classification is that the input patterns before and after the actual change time can be classified into two separate classes. The input patterns are the patterns of the input signals before calculating the RMS values; when a label is assigned to signal values, the input signal samples become input patterns.

Accordingly, for each approximate change point, a classification problem is defined in which the objective is to classify the input patterns into two classes and to find the class transition time from one class to another. The class transition time denotes the actual change time and lower/upper segment boundary.

To perform classification, data neighborhoods (DN) corresponding to each boundary index (m) are formed by taking the M+1 values of the input signal ($Y_i$) to the left of each index as expressed in the following equation:

$$DN_m = \{Y_i | CPI_m - M \leq i \leq CPI_m\}$$ (8)

where M denotes the neighborhood window size that should be specified. If an estimated value of the delay time is available, the window size can be set accordingly. Otherwise, the same window size used in the filtering step 101 can be used.

FIG. 5 shows an exemplary plot of the signal indices that are selected for fine-tuning. As an example, the first data neighborhood contains 8 samples between the $43^{rd}$ and $50^{th}$ indices. Numerically, the segment indices after fine-tuning are, as shown in FIG. 6, 1, 48, 95, 137, 193, and 256.

The specific feature vector used in the present exemplary classification includes two features, the chronologically-ordered index in each neighborhood (n) and the corresponding successive rate of change (n) of the input signal, i.e. $fv=[n, r_n]$ where $r_n = Y_n - Y_{n-1}$. It is known to those skilled in the art that depending upon the type of the application and complexity of signal variations, other features may be added to successfully distinguish data patterns before and after the change.

The feature vector is utilized as the input to a classifier. The classification is advantageously done in an unsupervised manner and as such there is no need for class labels and training. In a preferred embodiment, the k-means classifier is used in which the data patterns are partitioned into k mutually-exclusive clusters in such a way that observations in each cluster are as close to each other as possible, and as far from observations in other clusters as possible. k denotes the number of clusters, which must be specified. Normally, prior knowledge and cluster validation are necessary to determine the number of clusters. However, in the present example it is known that k=2 since at each change time there is one-dimensional change from one segment to another and therefore there are two segments and two clusters involved in each change point.

The k-means algorithm proceeds as follows:
define number of clusters;
initialize clusters arbitrarily;
compute sample mean of each cluster;
reassign each observation to the closest cluster;
if the clustering of any observation has changed, go to step three, otherwise stop. Clustering is complete.

Figure 6:
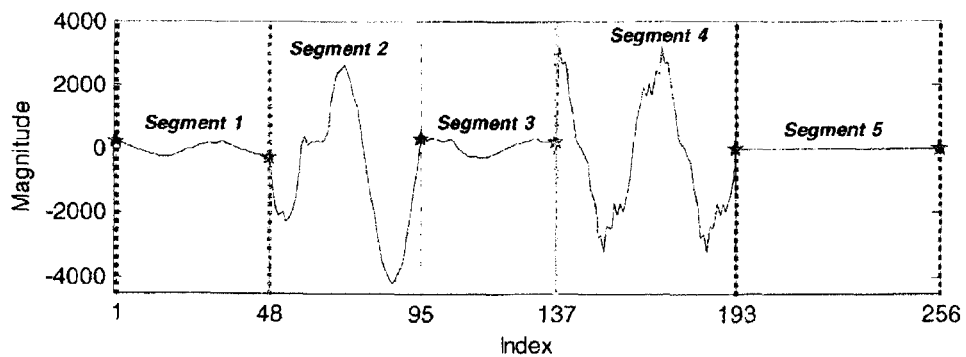
FIG. 6 shows the input signal of FIG. 2 segmented according to the method and apparatus according of the present invention.

FIG. 6 shows an exemplary plot of the segmentation results in which the input signal presented in FIG. 2 is segmented into 5 sections, each corresponding to a specific event in the time domain. It is noted that depending upon the application, one may be interested in zooming into each segment to find segments within the initial segments. In that case, it is conceivable that the segmentation approach shall be repeated with new threshold values using the signal samples in each segment as the input signal.

Finally, at step 103 each of the identified segments are classified as corresponding to a normal or abnormal condition, namely non-fault or fault condition, occurred in the power system based on the information content of each of the segments themselves, in the most broadest sense. In the example of FIG. 6, segments 1 and 3 corresponds to a normal condition, while segments 2, 4, and 5 correspond to abnormal conditions with segments 2 and 4 indicating a fault.

Figure 8:
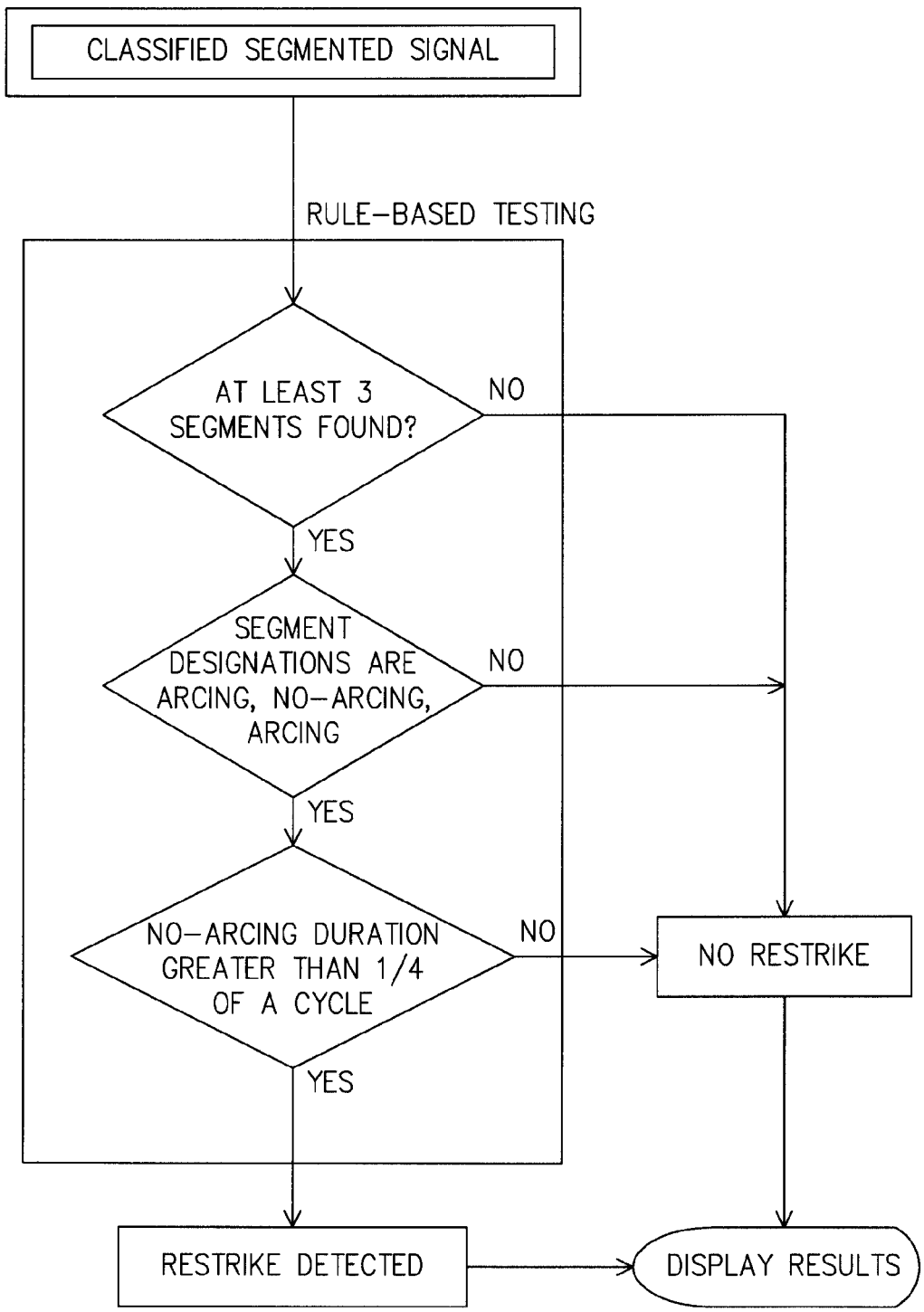
FIG. 8 is a flow chart showing a rule-based approach for detecting a potential re-strike on a power system by using the analysis executed on a waveform signal according to the method and apparatus of the present invention.

Segments corresponding to fault/no-fault periods can be identified for relay and circuit breaker applications. The fault/post fault segments and corresponding change times help detect re-strike and determine arcing times and total clearance time. Accurate signal segmentation and classification are crucial for a satisfactory performance. FIG. 8 shows a simple rule-based approach to detect a potential re-strike using segmentation results.

The method according to the invention is suitable for online and offline segmentation and classification of recorded events and disturbances in several power systems, in particular substation and feeder automation applications, can be applied to voltage, current, and other digital measurements.

As will be appreciated by one of ordinary skill in the art, the present invention may be embodied as or take the form of the method as previously described, or embedded in an intelligent electronic device (IED) for online or offline processing of digital waveforms which comprises a computer device having code therein configured to carry out the steps as previously described and defined in the corresponding appended claims. Further, it can take also the form of a computer readable medium having computer-readable instructions stored thereon which, when executed by a microprocessor, carry out the operations of the present inventions as previously described and defined in the corresponding appended claims. The computer-readable medium may be any medium that can contain, store, communicate, propagate, or transport the user-interface program instruction for use by or in connection with the instruction execution system, apparatus, or device and may by way of example but without limitation, be an electronic, magnetic, optical, electromagnetic, infrared, or semiconductor system, apparatus, device, or propagation medium or other suitable medium upon which the program is printed. More specific examples (a non-exhaustive list) of the computer-readable medium would include: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Computer program code or instructions for carrying out operations of the present invention may be written in any suitable programming language provided it allows achieving the previously described technical results.

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A method for remediating a restrike condition in a power system comprising:
    a) operating a current interrupter device coupled to the power system and structured to disrupt the flow of current through the power system;
    b) operating an intelligent electronic device in communication with the current interrupter device and the power system, the intelligent electronic device being structured to receive a waveform signal from the power system corresponding to an electrical characteristic of the power system;
    c) digitalizing the waveform signal obtained from said power system with the intelligent electronic device;
    d) filtering the digitalized waveform signal with the intelligent electronic device, said filtering occurring without any pre-modeling of said digitalized waveform signal;
    e) storing in a non-transitory computer readable medium said filtered waveform signal;
    f) identifying one or more segments on said stored, filtered waveform signal with the intelligent electronic device using a recursive cumulative sum technique comprising:
        i. determining change points by using a monitoring process on said filtered waveform in which there is no target value for a reference change parameter to accumulate a value for said reference change parameter that is a predetermined change in said filtered waveform signal,
        ii. continuing said accumulation of said values for said reference change parameter until all changes occurring in a defined threshold are detected in said filtered waveform signal,
        iii. declaring a change point when said accumulated value for said reference change parameter occurring in said defined threshold is equal to or higher than a predefined alarm value, the alarm value being structured to produce an intentional delay in detecting the change points, and
        iv. adjusting the declared change point effective to reduce the intentional delay by applying an unsupervised classification technique without the use of training data to said digitalized waveform signal, wherein the unsupervised classification technique includes forming a data neighborhood, and dividing the data neighborhood into two classes, the two classes being separated by a modified change point;
    g) classifying with the intelligent electronic device each of said one or more identified segments as corresponding to an arcing or non-arcing condition in the power system using information content in said digitalized waveform signal about each of said one or more identified segments;
    h) determining with the intelligent electronic device that the restrike condition is occurring within the current interrupter device using the classification of each of said one or more identified segments;
    i) storing, in the non-transitory computer readable medium, the one or more identified segments corresponding to an arcing in the power system and including the signal segmentation and classification with said reduced intentional delay; and
    j) operating a protective device to isolate the one or more identified segments corresponding to an arcing condition in the power system in response to the act of determining that the restrike condition is occurring.

2. The method of claim 1 wherein said step d) comprises re-sampling said digitalized waveform signal.

3. The method of claim 1 wherein, said step d) comprises removing DC components and noise from said digitalized waveform signal.

4. The method of claim 1 wherein said step d) comprises calculating the Root Mean Square (RMS) signal for the digitalized waveform signal over a moving window of fixed size.

5. The method of claim 1 wherein, said formed segment are formed each time a difference between successive determined change points is above a predefined cut-off value.

6. The method of claim 5 wherein it further comprises validating the one or more segments by using different values for one or more of said predefined cut-off value, said predefined alarm value, and a threshold value.

7. The method of claim 1 wherein said method further comprises storing in said intelligent electronic device said classification of said one or more identified segments as corresponding to an arcing or non-arcing condition having occurred in the power system, and displaying on said intelligent electronic device information about type and extent of said arcing condition occurrence in said power system.

8. The method of claim 1 wherein said current interrupter device includes a power.

9. A system comprising:
a current interrupter device structured to disrupt the flow of current in a power system; and
an intelligent electronic device structured to receive a waveform signal from the power system, said intelligent electronic device comprising a computer device including a non-transitory memory configured to encode program instructions and structured to execute the following program instructions encoded in memory:
   a) digitalize the waveform signal;
   b) filter the digitalized waveform signal, said filtering occurring without any pre-modeling of said digitalized waveform signal;
   c) identify one or more segments on said filtered waveform signal using a recursive cumulative sum technique comprising:
      i. determining change points on said filtered waveform signal by using a monitoring process in which there is no target value for a reference change parameter to accumulate a value for said reference change parameter that is a predetermined change in said filtered waveform signal,
      ii. continuing said accumulation of said values for said reference change parameter until all changes occurring in a defined threshold are detected in said filtered waveform signal,
      iii. declaring a change point when said accumulated value for said reference change parameter occurring in said defined threshold is equal to or higher than a predefined alarm value, the alarm value being structured to produce an intentional delay in detecting the change points, and
      iv. adjusting the declared change point effective to reduce the intentional delay by applying an unsupervised classification technique without the use of training data to said digitalized waveform signal, wherein the unsupervised classification technique includes forming a data neighborhood, dividing the data neighborhood into two classes, the two classes being separated by a modified change point;
   d) after said one or more segments are identified on said filtered waveform signal, use information content in said digitalized waveform signal about each of said one or more identified segments to classify each of said one or more identified segments as corresponding to an arcing or non-arcing condition having occurred in the power system; and
   e) determining a restrike condition is occurring within the current interrupter device using the classification of each of said one or more identified segments;
   f) storing, in the non-transitory memory, one or more of the identified segments indicating a restrike condition in the power system and including the signal segmentation and classification with said reduced intentional delay; and
   g) operating a protective device to isolate the one or more identified segments corresponding to a restrike condition in the power system in response to the act of determining that the restrike condition is occurring.

10. The system of claim 9, wherein said computer device has code therein configured to:
re-sample said digitalized waveform signal;
remove DC components and noise from said digitalized waveform signal.

11. The system of claim 9, wherein said computer device has code therein configured to calculate the RMS signal for the digitalized waveform signal over a moving window of fixed size.

12. The system of claim 9, wherein said computer device has code therein configured to group the determined change points to form clusters whose respective boundaries delimit approximate segment intervals of the filtered waveform signal, said formed clusters being formed each time a difference between successive identified change points is above a predefined cut-off value.

13. The system of claim 12, wherein said computer device has code therein configured to validate the formed clusters.

14. The system of claim 12, wherein said computer device has code therein configured to fine-tune the boundaries of the formed clusters said fine-tuning being performed based on a pattern of the digitalized waveform signal.

15. The system of claim 9 wherein said intelligent electronic device is further configured to store in said intelligent electronic device said classification of said one or more identified segments as corresponding to an arcing or non-arcing condition having occurred in the power system, and display on said intelligent electronic device information about type and extent of said arcing condition occurrence in said power system.

16. The system of claim 9 wherein said current interrupter device includes a switchgear.

17. An intelligent electronic device structured to communicate with a power system and a current interrupter structured to disrupt the flow of current in the power system, said intelligent electronic device comprising:
a non-transitory computer readable medium configured to encode program instructions and structured to execute the following program instructions encoded in memory:
   a) digitalize a waveform signal obtained from said power system;
   b) filter the digitalized waveform signal, said filtering occurring without any pre-modeling of said digitalized waveform signal;
   c) use a recursive cumulative sum technique to identify one or more segments on said filtered waveform signal, comprising:
      i. determining change points signal by using a monitoring process on said filtered waveform in which there is no target value for a reference change parameter to accumulate a value for said reference change parameter that is a predetermined change in said filtered waveform signal, ii. continuing said accumulation of said values for said reference change parameter until all changes occurring in a defined threshold are detected in said filtered waveform signal, iii. declaring a change point when said accumulated value for said reference change parameter occurring in said defined threshold is equal to or higher than a predefined alarm value, the alarm value being structured to produce an intentional delay in detecting the change points, and;

iv. adjusting the declared change point effective to reduce the intentional delay by applying an unsupervised classification technique without the use of training data to said digitalized waveform signal, wherein the unsupervised classification technique includes forming a data neighborhood, and dividing the data neighborhood into two classes, the two classes being separated by a modified change point;

d) using, after said one or more segments are identified on said filtered waveform signal information, content in said digitalized waveform signal about each of said one or more identified segments to classify each of said one or more identified segments as corresponding to an arcing or non-arcing condition having occurred in the power system;

e) determining a restrike condition is occurring within the current interrupter using the classification of each of said one or more identified segments;

f) storing, in the non-transitory computer readable medium, one or more of the identified segments indicating a restrike condition in the power system and including the signal segmentation and classification with said reduced intentional delay; and g) operating a protective device to isolate the one or more identified segments corresponding to a restrike condition in the power system in response to the act of determining that the restrike condition is occurring.

18. The intelligent electronic device of claim 17 comprising a display and additionally structured to store on the non-transitory computer readable medium said classification of said one or more identified segments as corresponding to an arcing or non-arcing condition having occurred in the power system, and display on a display associated and with said computing device information about type and extent of said abnormal condition occurrence tent in said power system.

19. The intelligent electronic device claim 17, said current interrupter including a power switchgear.

* * * * *